(12) United States Patent
Cook et al.

(10) Patent No.: US 6,528,345 B1
(45) Date of Patent: *Mar. 4, 2003

(54) PROCESS LINE FOR UNDERFILLING A CONTROLLED COLLAPSE

(75) Inventors: Duane Cook, San Jose, CA (US); Suresh Ramalingam, Fremont, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/262,132

(22) Filed: Mar. 3, 1999

(51) Int. Cl.⁷ .................. H01L 21/44; H01L 21/48; H01L 21/50
(52) U.S. Cl. .................. 438/108; 438/118; 438/119; 438/124; 438/127; 438/613
(58) Field of Search .................. 438/108, 118, 438/119, 124, 127, 613

(56) References Cited

U.S. PATENT DOCUMENTS

| | | |
|---|---|---|
| 4,322,737 A | 3/1982 | Sliwa, Jr. |
| 5,321,583 A | 6/1994 | McMahon |
| 5,371,325 A | 12/1994 | Gutierrez et al. |
| 5,371,328 A | 12/1994 | Gutierrez et al. |
| 5,629,566 A | 5/1997 | Doi et al. .................. 257/789 |
| 5,751,556 A | 5/1998 | Butler et al. |
| 5,766,982 A | 6/1998 | Akram et al. |
| 5,804,771 A | 9/1998 | McMahon et al. |
| 5,811,317 A | 9/1998 | Maheshwari et al. |
| 5,815,372 A | 9/1998 | Gallas |
| 5,817,542 A | 10/1998 | Sakemi |
| 5,821,456 A | 10/1998 | Wille et al. |
| 5,864,178 A | 1/1999 | Yamada et al. .............. 257/737 |
| 5,880,017 A | 3/1999 | Schwiebert et al. |
| 5,891,753 A | 4/1999 | Akram |

(List continued on next page.)

FOREIGN PATENT DOCUMENTS

| | | | |
|---|---|---|---|
| EP | 0340492 | * 11/1989 | .......... H01L/23/28 |
| EP | 0778616 A2 | 11/1997 | |
| JP | 63239827 | 5/1988 | |
| JP | 02056941 | 2/1990 | |
| JP | 03040458 | 2/1991 | |
| JP | 03041146 | 2/1991 | |
| JP | 07078616 | 3/1995 | |
| JP | 08153830 | 6/1996 | |
| JP | 10055832 | 2/1998 | |
| JP | 10107082 | 4/1998 | |

OTHER PUBLICATIONS

R. Lachance et al.: Corrosion/Migration Study of Flip Chip Underfill and Ceramic Overcoating, 1997.
International Search Report, PCT/US 00/03243, Aug. 2, 2000.

Primary Examiner—David L. Talbott
Assistant Examiner—David A. Zarneke
(74) Attorney, Agent, or Firm—Blakely, Sokoloff, Taylor & Zafman LLP

(57) ABSTRACT

A high throughput process line and method for underfilling an integrated circuit that is mounted to a substrate. The process line includes a first dispensing station that dispenses a first underfill material onto the substrate and an oven which moves the substrate while the underfill material flows between the integrated circuit and the substrate. The process line removes flow time (wicking time) as the bottleneck for achieving high throughput.

18 Claims, 2 Drawing Sheets

U.S. PATENT DOCUMENTS

| | | |
|---|---|---|
| 5,917,702 A | 6/1999 | Barrow |
| 5,919,329 A | 7/1999 | Banks et al. |
| 5,920,120 A | 7/1999 | Webb et al. |
| 5,936,304 A | 8/1999 | Lii et al. |
| 5,942,805 A | 8/1999 | Winer et al. |
| 5,953,814 A * | 9/1999 | Sozansky et al. .............. 29/840 |
| 5,959,362 A * | 9/1999 | Yoshino .................... 257/778 |
| 5,965,937 A | 10/1999 | Chiu et al. |
| 5,973,930 A | 10/1999 | Ikeda et al. |
| 5,981,313 A | 11/1999 | Tanaka ....................... 438/118 |
| 5,990,552 A | 11/1999 | Xie et al. |
| 5,991,161 A | 11/1999 | Samaras et al. |
| 5,998,242 A | 12/1999 | Kirkpatrick et al. |
| 6,001,703 A | 12/1999 | Winer et al. |
| 6,015,722 A | 1/2000 | Banks et al. |
| 6,049,122 A | 4/2000 | Yoneda |
| 6,049,124 A | 4/2000 | Raiser et al. |
| 6,057,381 A * | 5/2000 | Ma et al. ....................... 522/99 |
| 6,104,093 A | 8/2000 | Caletka et al. |
| 6,201,301 B1 | 3/2001 | Hoang |
| 6,238,948 B1 | 5/2001 | Ramalingam |

\* cited by examiner

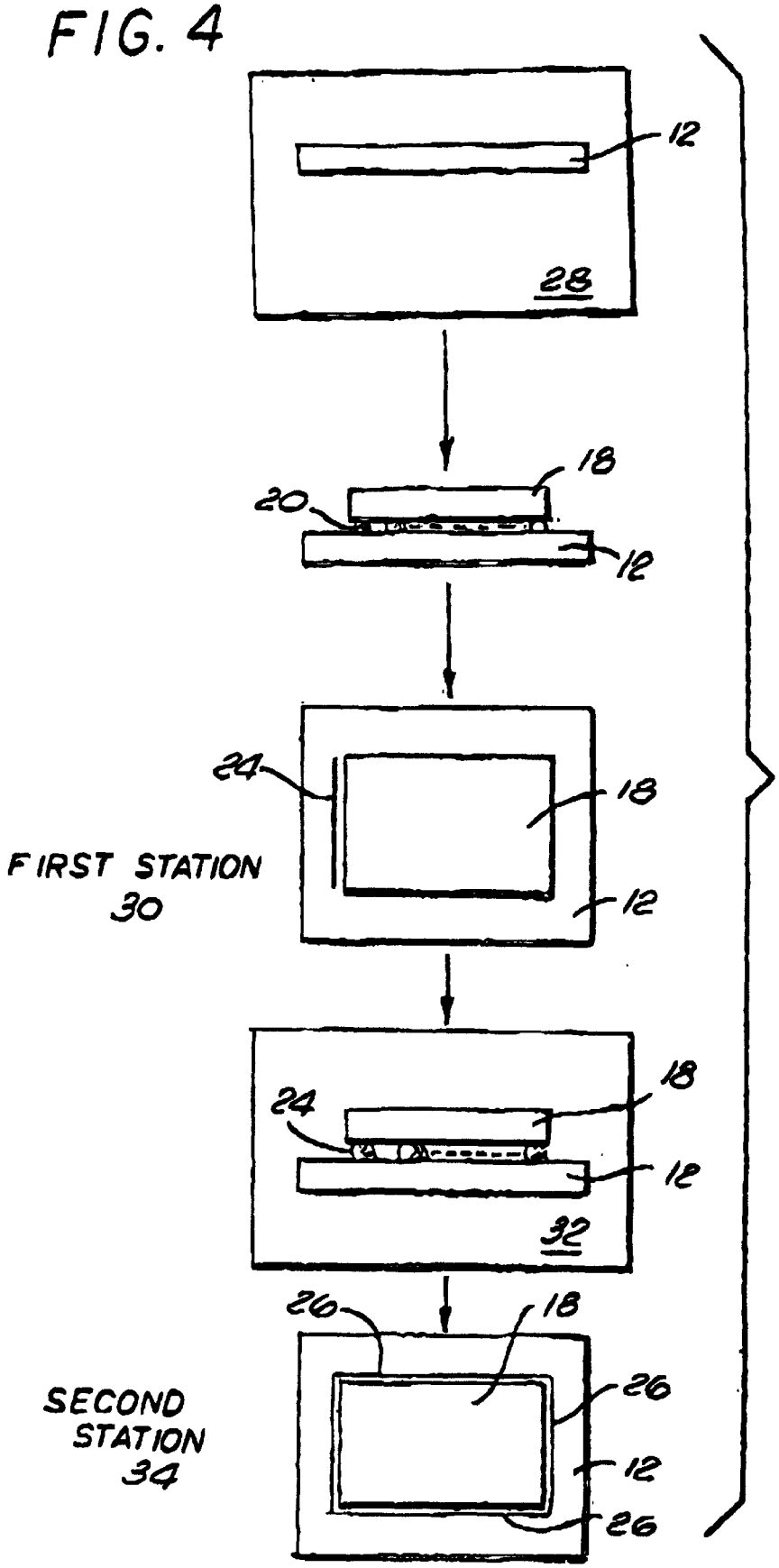

PROCESS LINE FOR UNDERFILLING A CONTROLLED COLLAPSE

BACKGROUND OF THE INVENTION

1. Field of the Invention

The present invention relates to an integrated circuit package.

2. Background Information

Integrated circuits are typically assembled into a package that is soldered to a printed circuit board. FIG. 1 shows a type of integrated circuit package that is commonly referred to as flip chip or C4 package. The integrated circuit 1 contains a number of solder bumps 2 that are soldered to a top surface of a substrate 3.

The substrate 3 is typically constructed from a composite material which has a coefficient of thermal expansion that is different than the coefficient of thermal expansion for the integrated circuit. Any variation in the temperature of the package may cause a resultant differential expansion between the integrated circuit 1 and the substrate 3. The differential expansion may induce stresses that can crack the solder bumps 2. The solder bumps 2 carry electrical current between the integrated circuit 1 and the substrate 3 so that any crack in the bumps 2 may affect the operation of the circuit 1.

The package may include an underfill material 4 that is located between the integrated circuit 1 and the substrate 3. The underfill material 4 is typically an epoxy which strengthens the solder joint reliability and the thermo-mechanical moisture stability of the IC package.

The package may have hundreds of solder bumps 2 arranged in a two dimensional array across the bottom of the integrated circuit 1. The epoxy 4 is typically applied to the solder bump interface by dispensing a single line of uncured epoxy material along one side of the integrated circuit. The epoxy then flows between the solder bumps. The epoxy 4 must be dispensed in a manner that covers all of the solder bumps 2.

It is desirable to dispense the epoxy 4 at only one side of the integrated circuit to insure that air voids are not formed in the underfill. Air voids weaken the structural integrity of the integrated circuit/substrate interface. Additionally, the underfill material 4 must have good adhesion strength with both the substrate 3 and the integrated circuit 1 to prevent delamination during thermal and moisture loading. The epoxy 4 must therefore be a material which is provided in a state that can flow under the entire integrated circuit/substrate interface while having good adhesion properties.

The substrate 3 is typically constructed from a ceramic material. Ceramic materials are relatively expensive to produce in mass quantities. It would therefore be desirable to provide an organic substrate for a C4 package. Organic substrates tend to absorb moisture which may be released during the underfill process. The release of moisture during the underfill process may create voids in the underfill material. Organic substrates also tend to have a higher coefficient of thermal expansion compared to ceramic substrates that may result in higher stresses in the die, underfill and solder bumps. The higher stresses in the epoxy may lead to cracks during thermal loading which propagate into the substrate and cause the package to fail by breaking metal traces. The higher stresses may also lead to die failure during thermal loading and increase the sensitivity to air and moisture voiding. The bumps may extrude into the voids during thermal loading, particularly for packages with a relatively high bump density. It would be desirable to provide a C4 package that utilizes an organic substrate.

SUMMARY OF THE INVENTION

One embodiment of the present invention is a process line and method for underfilling an integrated circuit that is mounted to a substrate. The process line includes a first dispensing station that dispenses a first underfill material onto the substrate and an oven which moves the substrate while the underfill material flows between the integrated circuit and the substrate.

BRIEF DESCRIPTION OF THE DRAWINGS

FIG. 4 is a schematic showing a process for assembling the integrated circuit package.

DETAILED DESCRIPTION OF THE INVENTION

Figure 1:
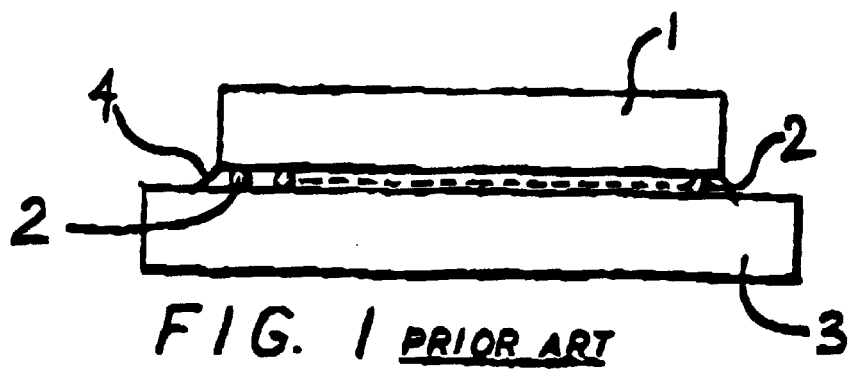
FIG. 1 is a side view of an integrated circuit package of the prior art.
Figure 2:
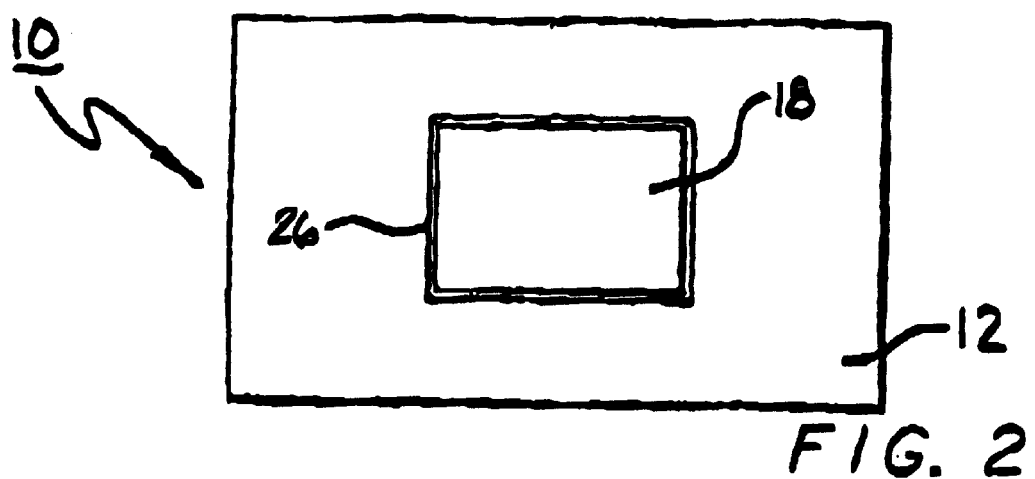
FIG. 2 is a top view of an embodiment of an integrated circuit package of the present invention.
Figure 3:
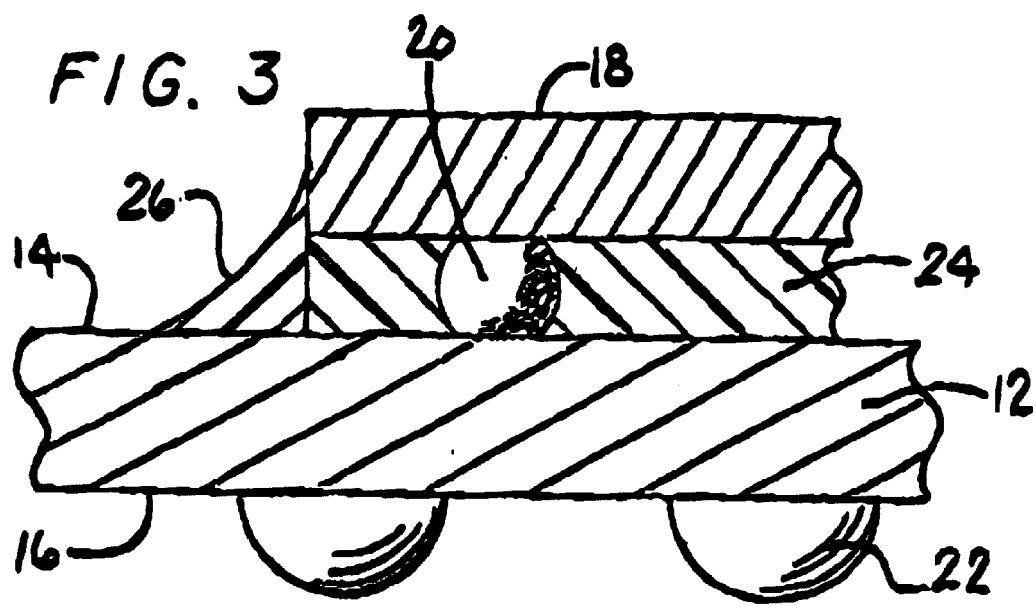
FIG. 3 is an enlarged side view of the integrated circuit package.

Referring to the drawings more particularly by reference numbers, FIGS. 2 and 3 show an embodiment of an integrated circuit package 10 of the present invention. The package 10 may include a substrate 12 which has a first surface 14 and a second opposite surface 16. An integrated circuit 18 may be attached to the first surface 14 of the substrate 12 by a plurality of solder bumps 20. The solder bumps 20 may be arranged in a two-dimensional array across the integrated circuit 18. The solder bumps 20 may be attached to the integrated circuit 18 and to the substrate 12 with a process commonly referred to as controlled collapse chip connection (C4).

The solder bumps 20 may carry electrical current between the integrated circuit 18 and the substrate 12. In one embodiment the substrate 12 may include an organic dielectric material. The package 10 may include a plurality of solder balls 22 that are attached to the second surface 16 of the substrate 12. The solder balls 22 can be reflowed to attach the package 10 to a printed circuit board (not shown).

The substrate 12 may contain routing traces, power/ground planes, vias, etc. which electrically connect the solder bumps 20 on the first surface 14 to the solder balls 22 on the second surface 16. The integrated circuit 18 may be encapsulated by an encapsulant (not shown). Additionally, the package 10 may incorporate a thermal element (not shown) such as a heat slug or a heat sink to remove heat generated by the integrated circuit 18.

The package 10 may include a first underfill material 24 that is attached to the integrated circuit 18 and the substrate 12. The package 10 may also include a second underfill material 26 which is attached to the substrate 12 and the integrated circuit 18. The second underfill material 26 may form a circumferential fillet that surround and seal the edges of the IC and the first underfill material 24. The sealing function of the second material 26 may inhibit moisture migration, cracking of the integrated circuit and cracking of the first underfill material.

The first underfill material 24 may be an epoxy produced by Shin-Etsu of Japan under the product designation Semicoat 5230-JP. The Semicoat 5230-JP material provides favorable flow and adhesion properties. The second underfill material 26 may be an anhydride epoxy produced by Shin-Etsu under the product designation Semicoat 122X. The Semicoat 122X material has lower adhesion properties then the Semicoat 5230-JP material, but much better fracture/crack resistance.

FIG. 4 shows a process for assembling the package 10. The substrate 12 may be initially baked in an oven 28 in step 1 to remove moisture from the substrate material. The substrate 12 is preferably baked at a temperature greater than the process temperatures of the remaining underfill process steps to insure that moisture is not released from the substrate 12 in the subsequent steps. By way of example, the substrate 12 may be baked at 163 degrees centigrade (°C.).

After the baking process, the integrated circuit 18 may be mounted to the substrate 12. The integrated circuit 18 is typically mounted by reflowing the solder bumps 20.

The first underfill material 24 may be dispensed onto the substrate 12 along one side of the integrated circuit 18 at a first dispensing station 30. The first underfill material 24 may flow between the integrated circuit 18 and the substrate 12 under a wicking action. By way of example, the first underfill material 24 may be dispensed at a temperature between 110 to 120° C. There may be a series of dispensing steps to fully fill the space between the integrated circuit 18 and the substrate 12.

The package 10 may be moved through an oven 32 to complete a flow out and partial gel of the first underfill material 24. By way of example, the underfill material 24 may be heated to a temperature of 120–145° C. in the oven 32 to partially gel the underfill material 24. Partial gelling may reduce void formation and improve the adhesion between the integrated circuit 18 and the underfill material 24. The improvement in adhesion may decrease moisture migration and delamination between underfill material 24 and the IC 18 as well as delamination between underfill material 24 and the substrate 12. The reduction in void formation may decrease the likelihood of bump extrusion during thermal loading. The package may be continuously moved through the oven 32 which heats the underfill material during the wicking process. Continuously moving the substrate 12 during the wicking process decreases the time required to underfill the integrated circuit and thus reduces the cost of producing the package. The substrate can be moved between stations 30 and 34 and through the oven 32 on a conveyer (not shown).

The second underfill material 26 may be dispensed onto the substrate 12 along all four sides of the integrated circuit 18 at a second dispensing station 34. The second underfill material 26 may dispensed in a manner which creates a fillet that encloses and seals the first material 24. By way of example, the second underfill material 26 may be dispensed at a temperature of approximately 80 to 120° C.

The first 24 and second 26 underfill materials may be cured into a hardened state. The materials may be cured at a temperature of approximately 150° C. After the underfill materials 24 and 26 are cured, solder balls 22 may be attached to the second surface 16 of the substrate 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A process line comprising:
   a first dispensing station to dispense a first underfill material onto a substrate being pre-heat at a first temperature;
   an oven to heat a continuously moving substrate at a second temperature lower than the first temperature while the first underfill material flows between an integrated circuit and the substrate; and
   a second dispensing station to dispense a second underfill material onto the substrate;
   the first and second underfill materials being made of different materials with the second underfill material having a lower adhesive property and greater fracture resistance than the first underfill material;
   the second underfill material forming a fillet that surrounds and seals an edge of the integrated circuit and the first underfill material, the fillet extending beyond the edge of the integrated circuit up a portion of a side of the integrated circuit, and the remaining portion of the side of the integrated circuit and a top surface of the integrated circuit being exposed and uncovered by the second underfill material.

2. The process line as recited in claim 1, wherein the first underfill material is an epoxy.

3. The process line as recited in claim 1, wherein the second underfill material is an anhydride epoxy.

4. The process line as recited in claim 1, wherein the oven heats the first underfill material to a partial gel state.

5. The process line as recited in claim 1, wherein the first underfill material directly contacts a bottom surface of the integrated circuit and a top surface of the substrate.

6. The process line as recited in claim 1, wherein the second underfill material has a lower adhesive property than the first underfill material.

7. A process comprising:
   dispensing a first underfill material, at a first dispensing station, onto a substrate being pre-heat at a first temperature;
   heating a continuously moving substrate at a second temperature lower than the first temperature, the first underfill material flowing between an integrated circuit and the substrate; and
   dispensing a second underfill material onto the substrate at a second dispensing station, the first and second underfill materials being made of different materials with the second underfill material having a lower adhesive property than the first underfill material, the second underfill material forming a fillet that surrounds and seals an edge of the integrated circuit and the first underfill material, the fillet extending beyond the edge of the integrated circuit to at least one-half the distance up a side of the integrated circuit, and the remaining side of the integrated circuit and a top surface of the integrated circuit being exposed and uncovered by the second underfill material.

8. The process as recited in claim 7, further comprising mounting an integrated circuit to the substrate with a solder bump.

9. The process as recited in claim 7, wherein the first underfill material directly contacts a bottom surface of the integrated circuit and a top surface of the substrate.

10. The process as recited in claim 7, further comprising heating the substrate before the first underfill material is dispensed.

11. The process as recited in claim 10, wherein the substrate is heated to a temperature that is greater than the temperature of the first underfill material moving through the oven.

12. A process comprising:

dispensing a first underfill material onto a substrate at a first dispensing station;

heating the substrate while the first underfill material flows between an integrated circuit and the substrate; and dispensing a second underfill material being made of a different material than the first underfill material at a second dispensing station, the second underfill material forming a fillet that surrounds and seals an edge of the integrated circuit and the first underfill.

13. The process as recited in claim 12 wherein the second underfill materials extends beyond the edge of the integrated circuit to cover at least a portion of a side of the integrated circuit.

14. The process as recited in claim 12, wherein the second underfill material has a lower adhesive property than the first underfill material.

15. The process as recited in claim 14, wherein the second underfill material has greater resistance to fracture than the first underfill material.

16. The process as recited in claim 14, wherein the heating of the substrate with the first underfill material occurs at a first temperature being greater than a second temperature at which the second underfill material is dispensed.

17. The process as recited in claim 16, wherein prior to dispensing the first underfill material, the method further comprising heating the substrate at a third temperature being greater than the first temperature.

18. The process as recited in claim 17 further comprising curing the first underfill material and the second underfill material substrate at a fourth temperature being greater than the first temperature.

\* \* \* \* \*

UNITED STATES PATENT AND TRADEMARK OFFICE
CERTIFICATE OF CORRECTION

PATENT NO. : 6,528,345 B1
DATED : March 4, 2003
INVENTOR(S) : Cook et al.

It is certified that error appears in the above-identified patent and that said Letters Patent is hereby corrected as shown below:

Column 3,
Line 4, delete "then", insert -- than --.

Signed and Sealed this

Tenth Day of June, 2003

JAMES E. ROGAN
*Director of the United States Patent and Trademark Office*